United States Patent [19]
Gardner et al.

[11] Patent Number: 6,124,175
[45] Date of Patent: *Sep. 26, 2000

[54] RAPID THERMAL ANNEAL WITH A GASEOUS DOPANT SPECIES

[75] Inventors: Mark I. Gardner, Cedar Creek; H. James Fulford, Austin, both of Tex.

[73] Assignee: Advanced Micro Devices Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/993,998

[22] Filed: Dec. 18, 1997

[51] Int. Cl.⁷ .................................................. H01L 21/336
[52] U.S. Cl. ........................ 438/305; 438/535; 438/696; 438/763
[58] Field of Search ..................... 438/514, 530, 438/301, 303, 305, 308, 535, FOR 187, FOR 158, FOR 199, 696, 763

[56] References Cited

U.S. PATENT DOCUMENTS

| | | |
|---|---|---|
| 5,006,477 | 4/1991 | Farb .......................................... 438/231 |
| 5,234,850 | 8/1993 | Liao .......................................... 438/231 |
| 5,387,545 | 2/1995 | Kiyota et al. . |
| 5,489,550 | 2/1996 | Moslehi . |
| 5,569,624 | 10/1996 | Weiner . |
| 5,599,735 | 2/1997 | Moslehi . |
| 5,866,472 | 2/1999 | Moslehi . |
| 5,930,617 | 7/1999 | Wu . |
| 5,937,301 | 8/1999 | Gardner et al. . |
| 5,956,584 | 9/1999 | Wu . |
| 5,994,175 | 11/1999 | Gardner et al. . |

*Primary Examiner*—George Fourson
*Assistant Examiner*—Joannie A. Garcia

[57] ABSTRACT

Rapid thermal anneal with a gaseous dopant species is disclosed. In one embodiment, a method includes three steps. In the first step, at least one gate is formed over a semiconductor substrate. In the second step, at least one spacer for each of the gates is formed, where each spacer is adjacent to an edge of its corresponding gate. In the third step, a rapid thermal anneal with a gaseous dopant species is performed to form source and drain regions within the substrate. Desirably, the source and drain regions meet the substrate underneath the gate at shallow junctions.

16 Claims, 5 Drawing Sheets

RAPID THERMAL ANNEAL WITH A GASEOUS DOPANT SPECIES

FIELD OF THE INVENTION

The present invention relates generally to integrated circuit manufacturing and more particularly to rapid thermal anneal with a gaseous dopant species.

BACKGROUND OF THE INVENTION

An insulated-gated field-effect transistor (IGFET), such as a metal-oxide semiconductor field-effect transistor (MOSFET), uses a gate to control an underlying surface channel joining a source and a drain. The channel, source and drain are located within a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

Within a transistor, each of the source and drain meets the substrate underneath the gate at what is known as a junction. For example, the substrate may be p-type semiconductor material, while the source and the drain may be doped such that they are n-type semiconductor material. The contact between the n-type semiconductor material and the p-type semiconductor material is thus called the p-n junction.

In a p-n junction, electron holes diffuse from the p-region, where their concentration is high, to the n-region, where their concentration is low. The deficit of positively charged holes creates a layer of negatively charged acceptors in the p-region close to the junction. In a similar way, electrons diffuse from the n-region, where their concentration is high, to the p-region where their concentration is low. The deficit of negatively charged electrons creates a layer of positively charged donors in the n-region near the junction.

This charged region, nearly devoid of holes in the p-region and nearly devoid of electrons in the n-region, is called a space charge region, or a depletion region. The charges in the depletion region create a potential barrier that prevents more electrons from coming into the p-region and prevents more holes coming into the n-regions. This potential barrier exists at the p-n junction without any applied bias. The potential difference is caused by different doping of the p and n regions.

Commonly, devices such as microprocessors for personal computers include a plurality of transistors. Desirably, these transistors have shallow depletion regions, or "shallow junctions." Shallow depletion regions provide for lower potential barriers within the transistors, meaning that they may be switched on and off more quickly than transistors having higher potential barriers. Semiconductor transistors, however, typically have large or "high" depletion regions, such that their potential barriers are correspondingly high, meaning that devices in which these transistors are fabricated may not have desirable performance characteristics, especially in terms of speed (clock rate).

This undesirable performance becomes especially disadvantageous and problematic in applications where speed is of the utmost importance, such as in microprocessors. There is a need, therefore, to fabricate transistors having shallow junctions, such that their correspondingly low potential barriers result in high-performance devices incorporating the transistors.

SUMMARY OF THE INVENTION

The above-mentioned shortcomings, disadvantages and problems are addressed by the present invention, which will be understood by reading and studying the following specification. The invention relates to the rapid thermal anneal with a gaseous dopant species. In one embodiment, a method includes three steps. In the first step, at least one gate is formed over a semiconductor substrate. In the second step, at least one spacer for each of the gates is formed. Each spacer is adjacent to an edge of its corresponding gate. In the third step, a rapid thermal anneal with a gaseous dopant species is performed to form source and drain regions within the substrate. Desirably, the source and drain regions meet the substrate underneath the gate at shallow junctions. These shallow junctions allow for the fabrication of high-performance devices such as microprocessors.

In a further embodiment of the invention, where there are two gates (a first gate and a second gate), prior to the performance of the rapid thermal anneal, a first mask is deposited over the first gate and is polished. The mask is desirably an oxide mask. The rapid thermal anneal is performed with an n-type gaseous species, such as arsenic. After this rapid thermal anneal, the first mask is removed, and a second mask is deposited over the second gate and polished. The second mask is also desirably oxide. A second rapid thermal anneal is performed, this time with a p-type gaseous species, such as boron. The second mask is then removed. The resulting structure thus includes a NMOSFET (the first gate with source and drain regions that are N-doped) and a PMOSFET (the second gate with source and drain regions that are P-doped).

The present invention describes methods, devices, and computerized systems of varying scope. In addition to the aspects and advantages of the present invention described here, further aspects and advantages of the invention will become apparent by reference to the drawings and by reading the detailed description that follows.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Figure 1A:
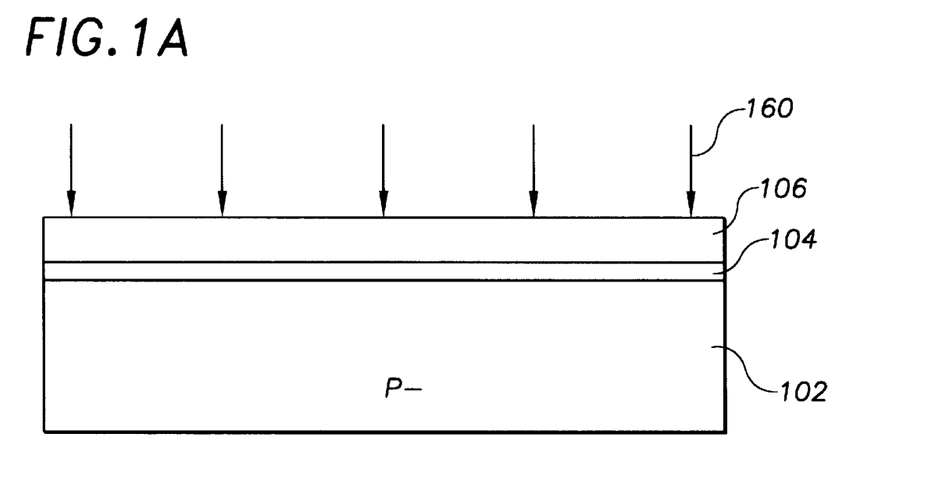
FIGS. 1A–1F show cross-sectional views of successive process steps for making an IGFET in accordance with one embodiment of the invention.

Described first is an IGFET known as a salicide-gate MOS. In FIG. 1A, silicon substrate 102 suitable for integrated circuit manufacture includes P-type epitaxial layer with a boron background concentration on the order of $1\times10^{16}$ atoms/cm$^2$, a <100>orientation and a resistivity of 12 ohm-cm. Desirably, the epitaxial surface layer is disposed on a P+ base layer, not shown, and includes a planar top surface. Gate oxide 104, comprise of silicon dioxide, is formed on the top surface of substrate 102 using oxide tube growth at a temperature of 700° C. to 1000° C., in an $O_2$ containing ambient. A typical oxidation tube contains several sets of electronically powered heating coils surrounding the tube, which is either quartz, silicon carbide, or silicon, desirably. In $O_2$ gas oxidation, the wafers are placed in the tube in a quartz boat and the gas flow is directed across the wafer surfaces to the opposite or exhaust end of the tub. Gate oxide 104 has a thickness of 30 angstroms, desirably.

Thereafter, a blanket layer of undoped polysilicon 106 is deposited by low pressure chemical vapor deposition (LPCVD) on the top surface of gate oxide 104. Polysilicon 106 has a thickness of 2000 angstroms, desirably. If also desired, polysilicon 106 can be doped in situ as deposition occurs, or doped before a subsequent etch step by implanting arsenic with a dosage in the range of $5\times10^{14}$ to $5\times10^{15}$ atoms/cm$^2$, and an energy in the range of 2 to 80 keV. However, it is generally desired that polysilicon 106 be doped during an implantation step following a subsequent etch step.

In FIG. 1A, the polysilicon 106 deposited on the substrate 102 is implanted with arsenic ions and then with nitrogen ions, as depicted by arrows 160. The arsenic ions enhance the rate of silicon dioxide growth in subsequent oxidation processes used to add or grow an additional layer of silicon dioxide. The arsenic ion implant has a dosage in the range of $5\times10^{14}$ to $5\times10^{15}$ atoms/cm$^2$, and an energy level ranging between about 2 to 80 keV. Doping with nitrogen is optional. The arrows 160 depict either the single step of doping with arsenic ions, or the two steps of doping with arsenic and then doping with nitrogen ions. The nitrogen ions may be added to retard the diffusion of the arsenic atoms. If the polysilicon is to be doped with nitrogen ions, the polysilicon may be implanted at this point in the process at a dosage of $5\times10^{14}$ to $5\times10^{15}$ atoms/cm$^2$, and at an energy level of 20 to 200 keV. Nitrogen ions may be implanting after etching the polysilicon.

Figure 1B:
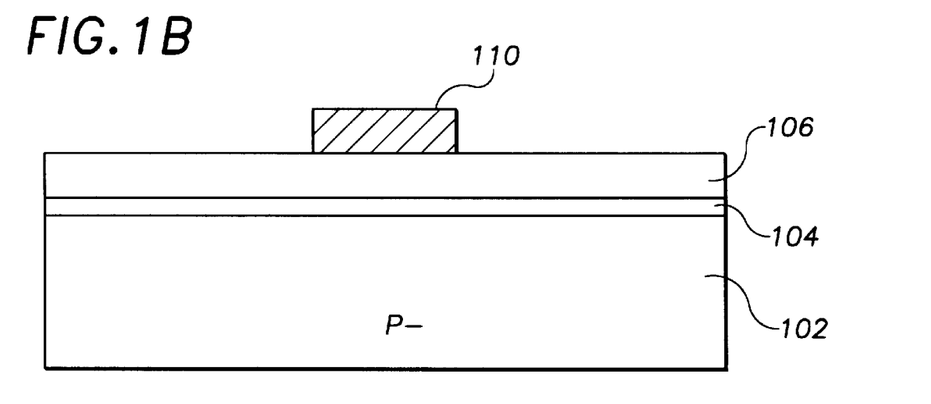

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 1C:
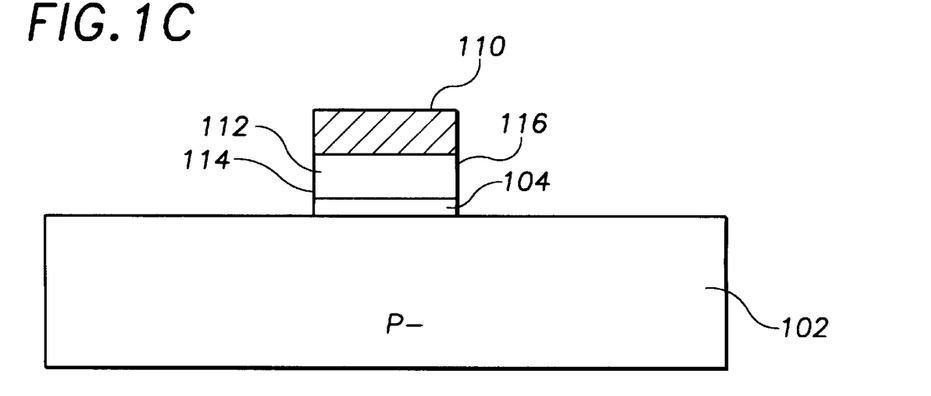

In FIG. 1C, an anisotropic etch is applied that removes the exposed portions of polysilicon 106 and the underlying portions of gate oxide 104. Desirably, a first dry etch is applied that is highly selective of polysilicon, and a second dry etch is applied that is highly selective of silicon dioxide, using photoresist 110 as an etch mask. After etching occurs, the remaining portion of polysilicon 106 provides polysilicon gate 112 with opposing vertical sidewalls (or, edges) 114 and 116. Polysilicon gate 112 has a length (between sidewalls 114 and 116) of 3500 angstroms, desirably.

Figure 1D:
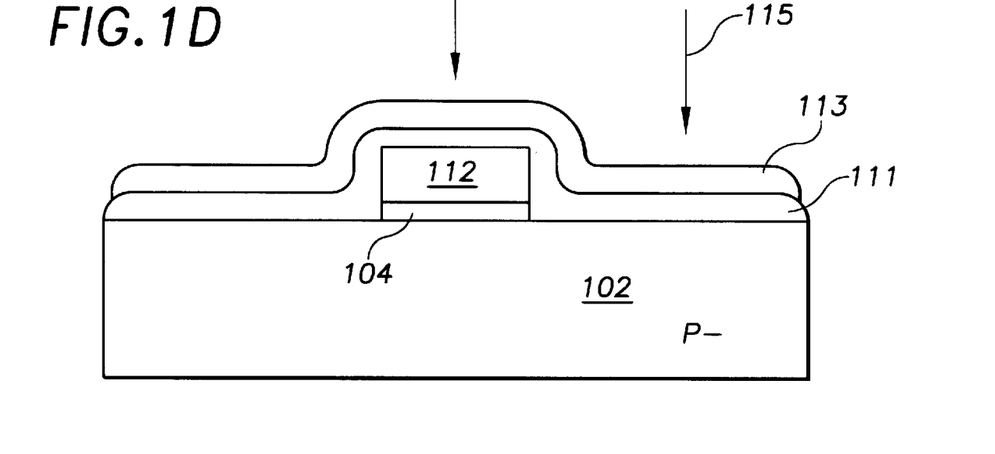

In FIG. 1D, photoresist 110 is stripped, and oxide layer 111 and nitride layer 113 are formed. Oxide layer 111, comprised of silicon dioxide, is formed desirably using oxide tube growth at a temperature of 700° C. to 1000° C., in an $O_2$ containing ambient. A typical oxidation tube contains several sets of electronically powered heating coils surrounding the tube, which is either quartz, silicon carbide, or silicon, desirably. Nitride layer 113 is formed desirably by doping the oxide layer 111 with nitrogen ions, such as by ion implantation. This doping is shown in FIG. 1D by arrows 115. Each of nitride layer 113 and oxide layer 111 is desirably fifty angstroms in thickness.

Figure 1E:
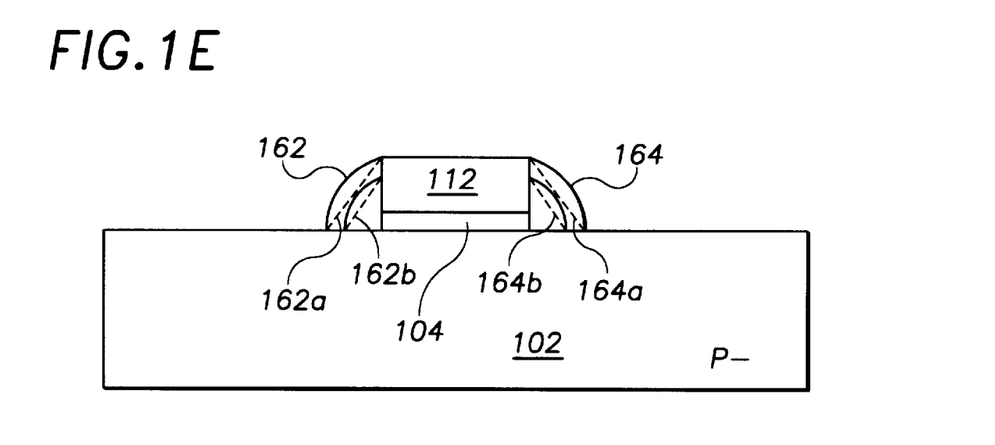

In FIG. 1E, spacers 162 and 164 are formed from oxide layer 111 and nitride layer 113, by etching the layers until only spacers 162 and 164 remain. Spacer 162 is thus made up of two parts: a nitride part 162a (from nitride layer 113) and an oxide part 162b (from oxide layer 111).

Likewise, spacer 164 is made up of two parts: a nitride part 164a (from nitride layer 113) and an oxide part 164b (from oxide layer 113). The thickness of each of spacers 162 and 164 is desirably one-hundred angstroms in thickness.

Figure 1F:
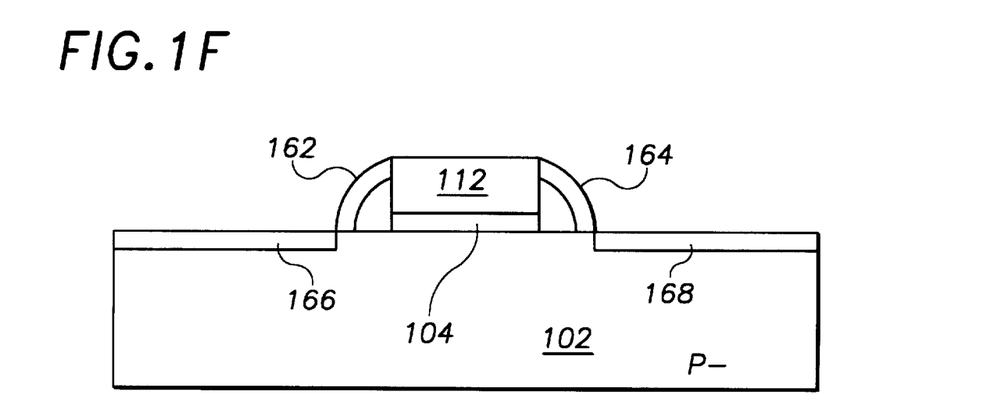

In FIG. 1F, source and drain regions 166 and 168 are formed by a rapid thermal anneal with a gaseous dopant species. The rapid thermal anneal thus is used to transmit the gaseous dopant species within substrate 102 to create regions 166 and 168. The rapid thermal anneal is desirably performed at 800 to 1000 degrees Celsius, for about ten to sixty seconds. The gaseous dopant species may be n-type, if an NMOSFET is desired, or p-type, if a PMOSFET is desired. Such dopant species include arsenic (n-type), and boron (p-type).

The regions 166 and 168 abut semiconductor substrate 102 underneath the gate 112 (more specifically, underneath the spacers 162 and 164 adjacent to the gate 112) at a shallow junction, such that the resulting device created in FIGS. 1A–1F has desirable high-performance characteristics. Not shown in FIG. 1F are the conventional processing steps of metal salicidation, placing glass over the surface, and forming a contact opening for subsequently placed connectors. A passivation layer may also then be deposited as a top surface. Additionally, the principal processing steps disclosed herein may be combined with other steps apparent and known to those skilled in the art.

A more complicated structure, having both a NMOSFET and a PMOSFET, may be constructed following the processing steps of FIGS. 2A–2F. Those of ordinary skill within the art will appreciate that the description of these processing steps relies upon knowledge of the processing steps of FIGS. 1A–1F already described, such that only those steps needed to describe to one of ordinary skill in the art how to make and use the embodiment resulting from FIGS. 2A–2F are described.

Figure 2A:
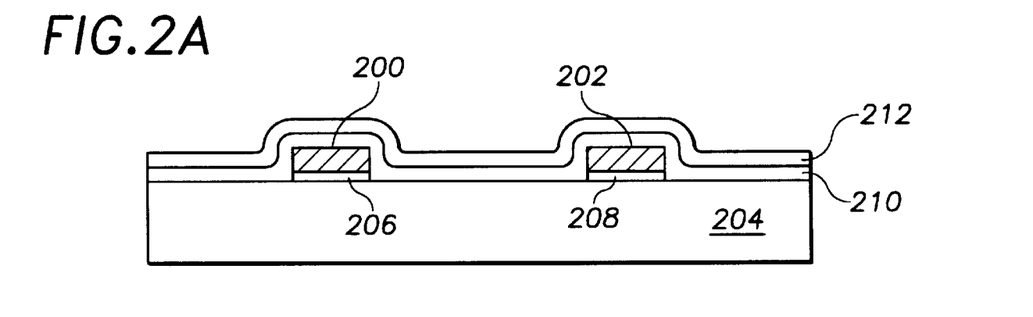
FIGS. 2A–2F show cross-sectional views of successive process steps for making an NMOSFET and a PMOSFET, in conjunction with the process of FIGS. 1A–1F, in accordance with one embodiment of the invention; and, FIG. 3 is a diagram of a computerized system, in accordance with which the invention may be implemented.

Referring first to FIG. 2A, polysilicon gates 200 and 202 are formed on silicon substrate 204. Gate 200 has gate oxide 206 between the gate and substrate 204, while gate 202 has gate oxide 208 between the gate and substrate 204. On top of gates 200 and 202, and the exposed region of substrate 204 (i.e., those areas of substrate 204 not masked by gates 200 and 202) is placed an oxide layer 210 and a nitride layer 212. Gates 200 and 202, gate oxides 206 and 208, and layers 210 and 212 may be performed substantially as has been described in conjunction with FIGS. 1A–1D, as those of ordinary skill within the art can appreciate.

Figure 2B:
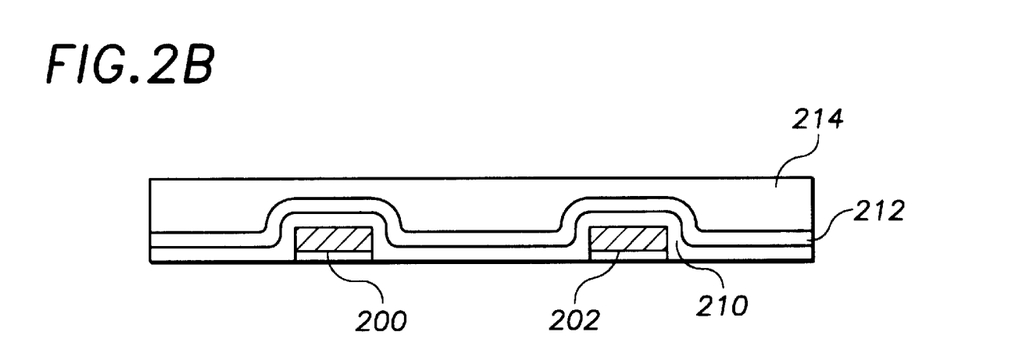

In FIG. 2B, an oxide mask 214 is deposited over gates 200 and 202, and their overlaying layers 210 and 212. After deposition, the oxide mask 214 is polished such that its top surface is flat. The invention is not limited to the manner by which the oxide is deposited as mask 214, and polished so that its top surface is flat.

Figure 2C:
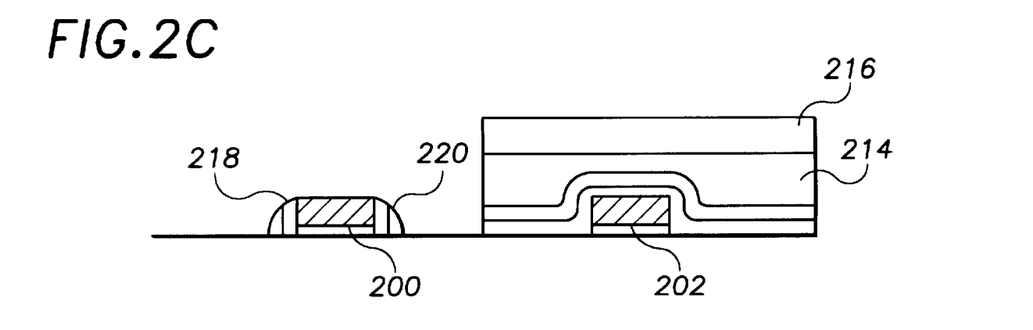

In FIG. 2C, photoresist 216 is deposited as a continuous layer on oxide mask 214 and selectively irradiated. Thereafter, the photoresist 216 is developed and the irradiated portions of the photoresist are removed to provide openings in photoresist 216 such that only gate 202 is covered by photoresist. An etchant is then applied that removes the exposed portions of oxide mask 216. The etching also forms spacers 218 and 220 to either side of gate 200. Each spacer includes an oxide part (from oxide layer 210) and a nitride part (from nitride layer 212).

Figure 2D:
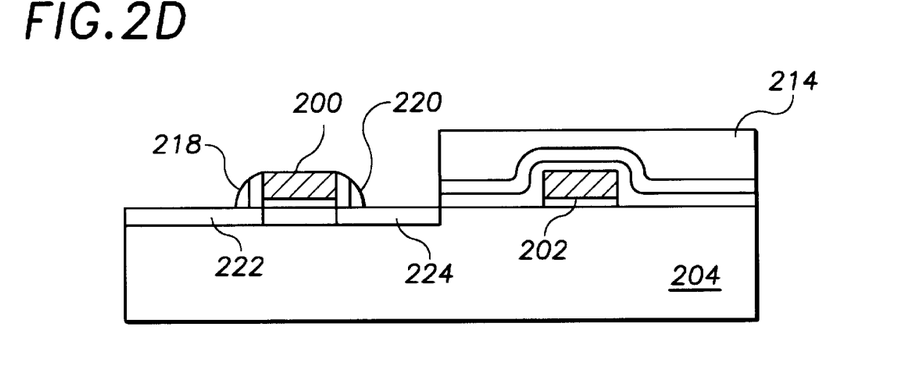

In FIG. 2D, photoresist 216 is stripped, and source and drain regions 222 and 224 are formed by a rapid thermal anneal with an n-type gaseous dopant species. The rapid thermal anneal is desirably performed at 800 to 1000 degrees Celsius, for about ten to sixty seconds. The gaseous dopant species is n-type so that an NMOSFET is created. Such dopant species include arsenic. The regions 222 and 224 abut semiconductor substrate 204 underneath the gate 200 (more specifically, underneath the spacers 218 and 220 adjacent to the gate 200) at a shallow junction, such that the resulting device has desirable high-performance characteristics.

Figure 2E:
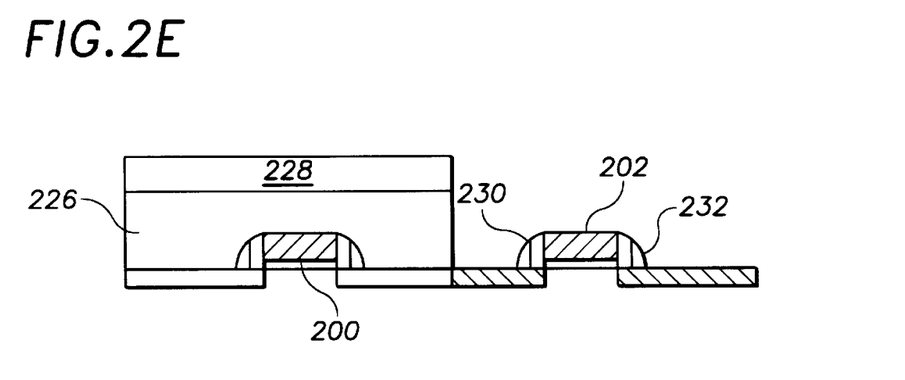

In FIG. 2E, another oxide mask 226 is deposited over gate 200. The oxide mask 226 (together with oxide mask 214) is polished such that their top surface is flat. Photoresist 228 is deposited as a continuous layer on oxide mask 214 and 226 and selectively irradiated. Thereafter, the photoresist 228 is developed and the irradiated portions of the photoresist are removed to provide openings in photoresist 228 such that only gate 200 is covered by photoresist. An etchant is then applied that removes oxide mask 214. The etching also forms spacers 230 and 232 to either side of gate 202. Each spacer includes an oxide part (from oxide layer 210) and a nitride part (from nitride layer 212).

Figure 2F:
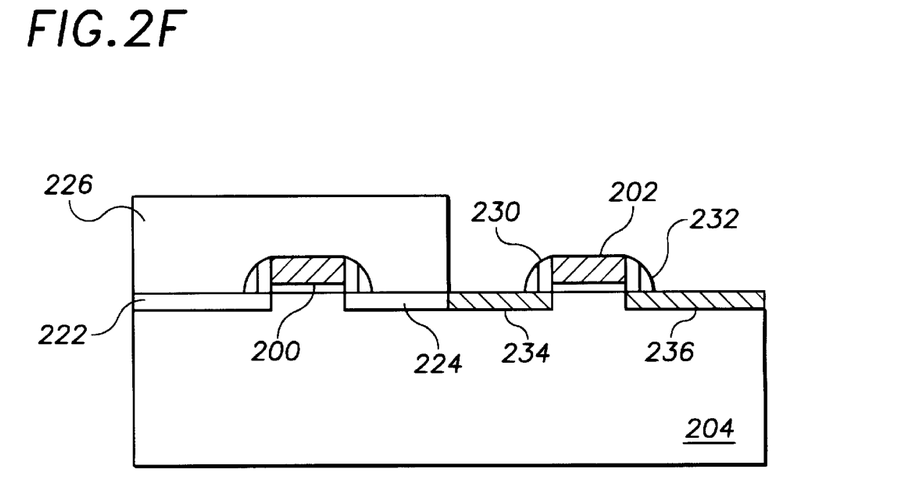

In FIG. 2F, source and drain regions 234 and 236 are formed by a rapid thermal anneal with a p-type gaseous dopant species. The rapid thermal anneal is desirably performed at 800 to 1000 degrees Celsius, for about ten to sixty seconds. The gaseous dopant species is p-type so that a PMOSFET is created. Such dopant species include boron. The regions 234 and 236 abut semiconductor substrate 204 underneath the gate 202 (more specifically, underneath the spacers 230 and 232 adjacent to the gate 202) at a shallow junction, such that the resulting device desirable high-performance characteristics. Therefore, the result of steps FIGS. 2A–2F is a CMOS device, including both an NMOS and a PMOS device.

Figure 3:
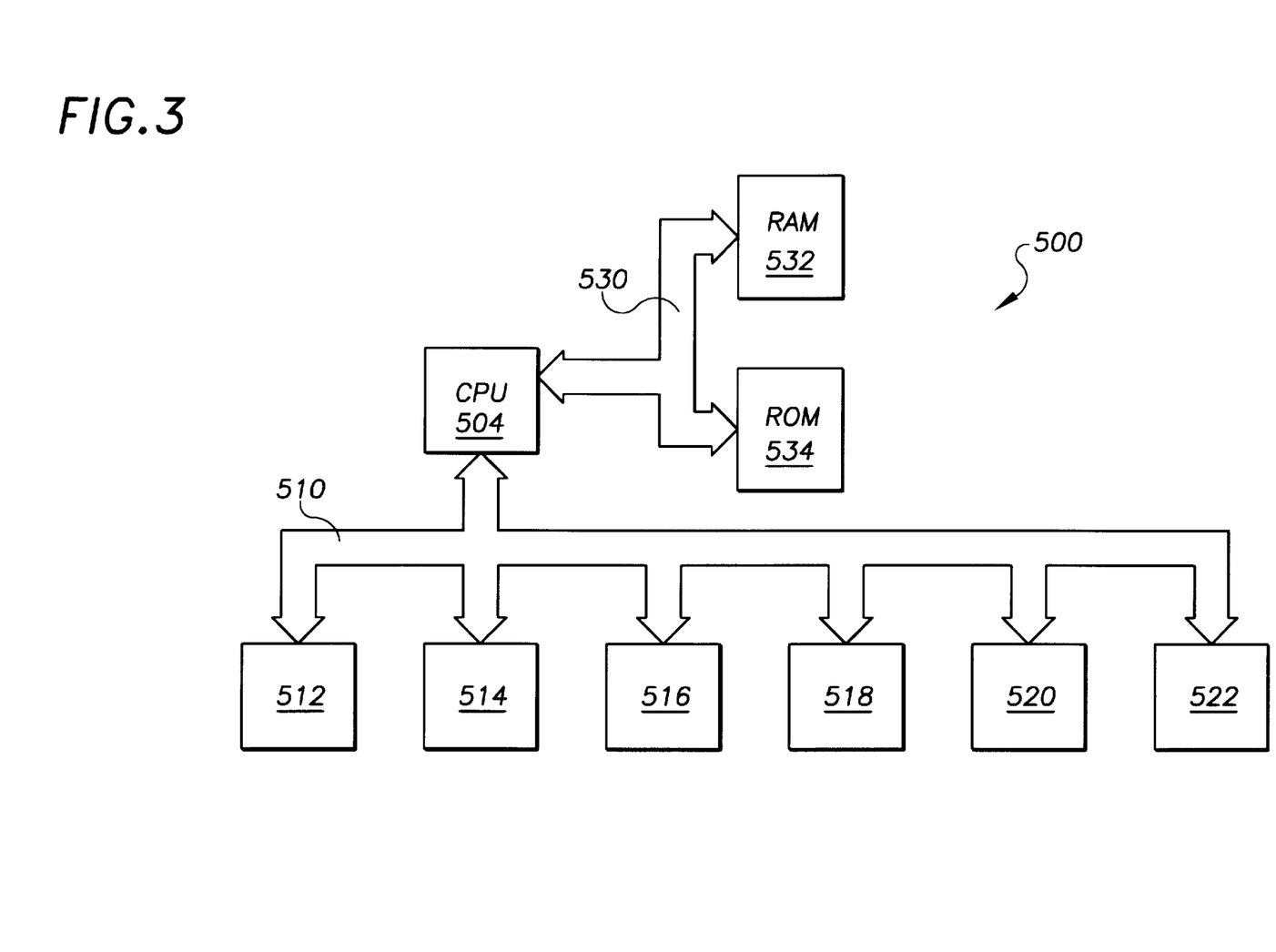

Referring next to FIG. 3, advantageously the invention is well-suited for use in a device such as an integrated circuit chip, as well as an electronic system including a central processing unit, a memory and a system bus. The electronic system may be a computerized system 500 as shown in FIG. 3. The system 500 includes a central processing unit 504, a random access memory 532, and a system bus 530 for communicatively coupling the central processing unit 504 and the random access memory 532. The system 500 includes a device formed by the steps shown in and described in conjunction with FIGS. 1A–1F. The system 500 may also include an input/output bus 510 and several peripheral devices, such as devices 512, 514, 516, 518, 520 and 522, which may be attached to the input/output bus 510. Peripheral devices may include hard disk drives, floppy disk drives, monitors, keyboards, and other such peripherals. The graded doping regions having a triangular geometry in the device provides for a fast and reliable channel having a long life. Faster channels are needed as clocking speeds for microprocessors increase, and the channel must also be reliable and long-lived.

Rapid thermal annealing with a gaseous dopant species has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the following claims and equivalents thereof.

We claim:

1. A method for forming a device comprising:

forming at least one gate over a semiconductor substrate;

forming at least one spacer respectively adjacent to an edge of the at least one gate, including depositing a first oxide layer over said gate, forming a second layer over said first oxide layer by doping said first oxide layer with nitrogen via ion implantation and etching said first and second layers to form said at least one spacer; and performing a rapid thermal anneal with a gaseous dopant species, wherein source and drain regions are formed within the substrate.

2. A method for forming a device comprising:

forming at least one gate over a semiconductor substrate, wherein the at least one gate comprises a first gate and a second gate;

forming at least one spacer respectively adjacent to an edge of the at least one gate, wherein forming said spacer includes depositing a first oxide layer over said gate, forming a second layer over said first oxide layer by doping said first oxide layer with nitrogen via ion implantation and etching said first and second layers to form said spacer;

depositing a first mask over the first gate;

polishing the first mask;

performing a rapid thermal anneal with a first gaseous dopant species, wherein source and drain regions are formed within the substrate;

removing the first mask from the first gate;

depositing a second mask over the second gate;

polishing the second mask; and performing a rapid thermal anneal with a second gaseous dopant species, wherein additional source and drain regions are formed within the substrate.

3. The method of claim 2, wherein the first mask comprises an oxide mask.

4. The method of claim 3, wherein the second mask comprises an oxide mask.

5. The method of claim 2, wherein the second gaseous dopant species comprises boron gas to form the additional source and drain regions.

6. The method of claim 2, wherein the first gaseous dopant species comprises arsenic gas to form the source and drain regions.

7. The method of claim 1, wherein the rapid thermal anneal is performed at a temperature within the range of 800 to 1100 degrees Celsius.

8. The method of claim 1, wherein the rapid thermal anneal is performed for ten to sixty seconds.

9. The method according to claim 2, wherein the rapid thermal anneal is performed at a temperature within the range of 800 to 1100° C.

10. The method according to claim 2, wherein the rapid thermal anneal is performed for ten to sixty seconds.

11. The method of claim 1, wherein the gaseous dopant species comprises arsenic gas to form the source and drain regions.

12. The method of claim 11, wherein the rapid thermal anneal is performed at a temperature within the range of 800 to 1100 degrees Celsius.

13. The method of claim 12, wherein the rapid thermal anneal is performed for ten to sixty seconds.

14. The method of claim 6, wherein the second gaseous dopant species comprises boron gas to form the additional source and drain regions.

15. The method of claim 14, wherein the rapid thermal anneal is performed at a temperature within the range of 800 to 1100 degrees Celsius.

16. The method of claim 15, wherein the rapid thermal anneal is performed for ten to sixty seconds.

* * * * *

UNITED STATES PATENT AND TRADEMARK OFFICE
CERTIFICATE OF CORRECTION

PATENT NO. : 6,124,175
DATED : September 26, 2000
INVENTOR(S) : Gardner et al.

It is certified that error appears in the above-identified patent and that said Letters Patent is hereby corrected as shown below:

<u>Title page,</u>
Item [75], Inventor, "James Fulford" should read -- Jim Fulford --.

Signed and Sealed this

Nineteenth Day of November, 2002

Attest:

Attesting Officer

JAMES E. ROGAN
*Director of the United States Patent and Trademark Office*